United States Patent
Yonaha

[11] Patent Number: 5,820,677
[45] Date of Patent: Oct. 13, 1998

[54] COATER

[75] Inventor: Shinya Yonaha, Tokyo, Japan

[73] Assignee: NEC Corporation, Tokyo, Japan

[21] Appl. No.: 931,671

[22] Filed: Sep. 17, 1997

[30] Foreign Application Priority Data

Sep. 20, 1996 [JP] Japan .................................. 8-249959

[51] Int. Cl.$^6$ .................................................. C23C 16/00
[52] U.S. Cl. ......................... 118/680; 118/320; 118/708; 118/712
[58] Field of Search ................................. 118/680, 708, 118/712, 320

[56] References Cited

FOREIGN PATENT DOCUMENTS 63-301520  12/1988  Japan .
 5-251326   9/1993  Japan .

Primary Examiner—Richard Bueker
Attorney, Agent, or Firm—Laff, Whitesel, Conte & Saret, Ltd.

[57] ABSTRACT

A spinning type coater for forming a thin film on a substrate by dropping a liquid onto the substrate is disclosed. An annular light-sensitive element is mounted on a peripheral portion of a rotatable table which is to be loaded with a substrate. A block carrying a nozzle or nozzles therewith is movable over the table in X and Y directions. A light emitting element for emitting light having a long wavelength is mounted on the block.

10 Claims, 5 Drawing Sheets

COATER

BACKGROUND OF THE INVENTION

The present invention relates to a spinning type coater for forming a thin film on a substrate by dropping a liquid onto the substrate. More particularly, the present invention is concerned with a coater for allowing a liquid to drop onto the center of rotation of a substrate and form a uniform thin film on the substrate.

In a semiconductor device, LCD (Liquid Crystal Display) or similar production line, various kinds of thin protection films including a photoresist film are formed on a substrate. To form such thin films, use is made of a method generally referred to as a spinning method. The spinning method causes a liquid to drop from a nozzle or nozzles onto the center of rotation of a spinning wafer and spread over the entire substrate due to a centrifugal force. Should the liquid fail to drop onto the center of rotation of the substrate, it would not form a uniform thin film on the substrate. Japanese Patent Laid-Open Publication Nos. 63-301520 and 5-251326, for example teach technologies for insuring the drop of the liquid onto the center of rotation of the substrate.

Specifically, the above Laid-Open Publication No. 63-301520 discloses a photoresist coater including a plurality of liquid nozzles and locating the nozzles above the center of rotation of a substrate. For this purpose, the nozzles are moved by a feed screw in the radial direction of the substrate. However, the document does not teach how the nozzles are brought to a stop at the position above the center of rotation of the substrate. For example, if the nozzles are moved by hand, then the visual point dependent on the person and the irregular accuracy of convergence to the center of rotation are problematic. Further, because the manual operation cannot be effected unless the operation of the coater is interrupted, the adjustment is time-consuming and degrades productivity. In addition, even if accurate adjustment is achievable with the manual operation, it is impractical for the operator to inspect the nozzles frequently. It is therefore likely that the deviation of the nozzles cannot be found at its early stage, reducing the yield.

The Laid-Open Publication No. 5-251326 discloses a spinner using the fact that when the center of rotation of a substrate retained by a chuck is deviated from a preselected center of rotation, the substrate oscillates. The spinner measures a horizontal displacement of a rotary shaft supporting a substrate and a rotation angle of the shaft, and thereby calculates an amount and a direction of deviation of the substrate. With the amount and direction of deviation, it is possible to correct a position where a substrate to be put on the chuck next should be stopped. Although the spinner includes a sensor responsive to the amount of horizontal displacement of the chuck and a sensor responsive to the rotation angle of the chuck, such factors cannot be accurately measured without resorting to an extremely sophisticated arrangement which would increase the cost of the product.

SUMMARY OF THE INVENTION

It is therefore an object of the present invention to provide a coater capable of easily detecting the center of rotation of a rotatable table and locating a nozzle or nozzles above the center of rotation.

BRIEF DESCRIPTION OF THE DRAWINGS

The above and other objects, features and advantages of the present invention will become apparent from the following detailed description taken with the accompanying drawings in which.

Figure 1:
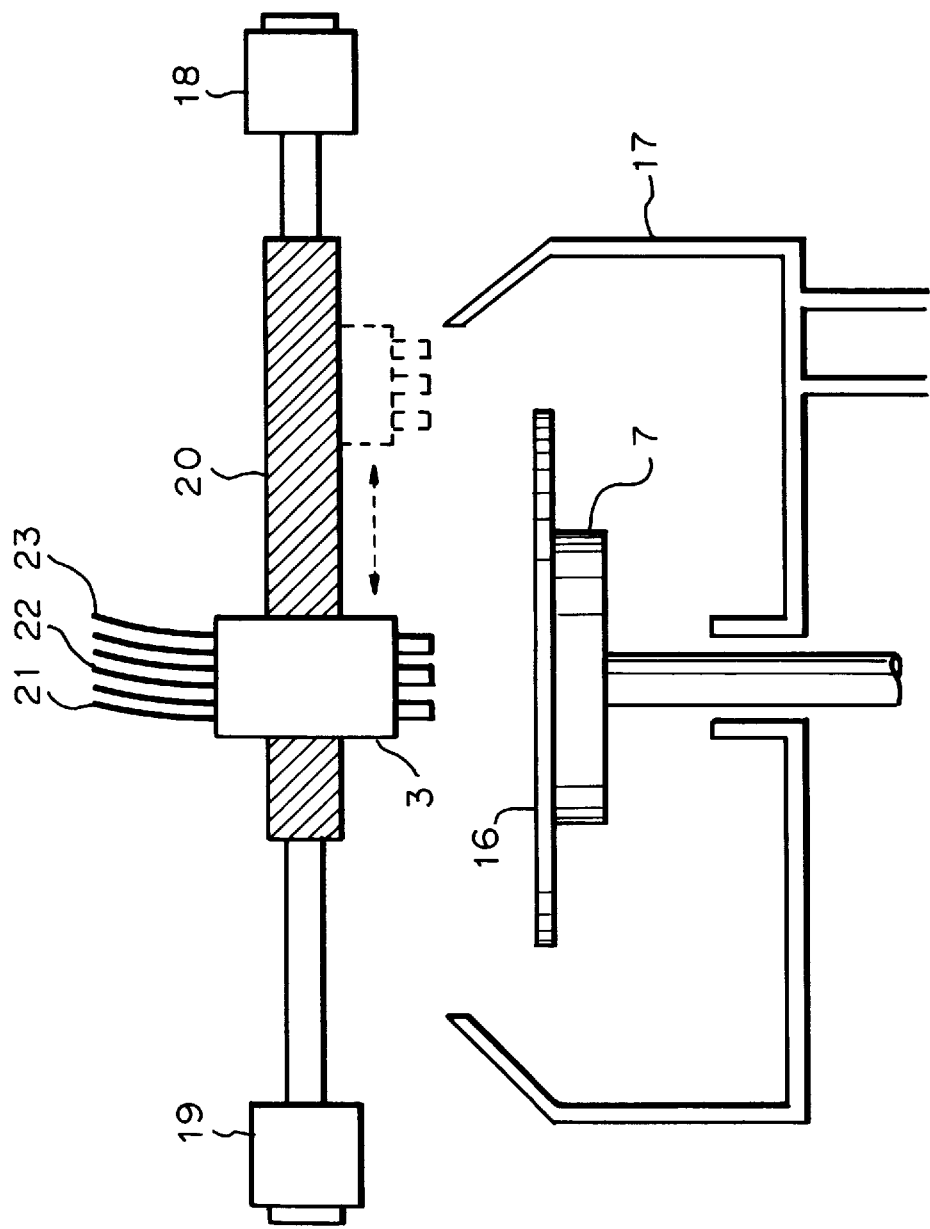
FIG. 1 is a side elevation showing a conventional photoresist coater.

In the drawings, identical references denote identical structural elements.

DESCRIPTION OF THE PREFERRED EMBODIMENTS

To better understand the present invention, brief reference will be made to a conventional photoresist coater taught in the previously mentioned Laid-Open Publication No. 63-301520. As shown in FIG. 1, the conventional coater includes a block 3 carrying a plurality of nozzles 21, 22 and 23 therewith. A semiconductor wafer or similar substrate 16 is laid on a rotatable table 7. The block 3 is movable back and forth in the radial direction of the substrate 16, as indicated by a double-headed phantom arrow in FIG. 1. The block 3 is mounted on a feed screw 20 operatively connected to a motor 18. The motor 18 is driven by an encoder 19 capable of detecting a position with accuracy. In this configuration, the nozzles 21–23 are moved toward a position above the center of the substrate 16 by the encoder 19, motor 18, and screw 20. The substrate 16 is rotated within a top-open cup or casing 17, so that a liquid dropped onto the substrate 17 is prevented from being scattered around.

The coater shown in FIG. 1, however, has some problems left unsolved, as discussed earlier.

Figure 2:
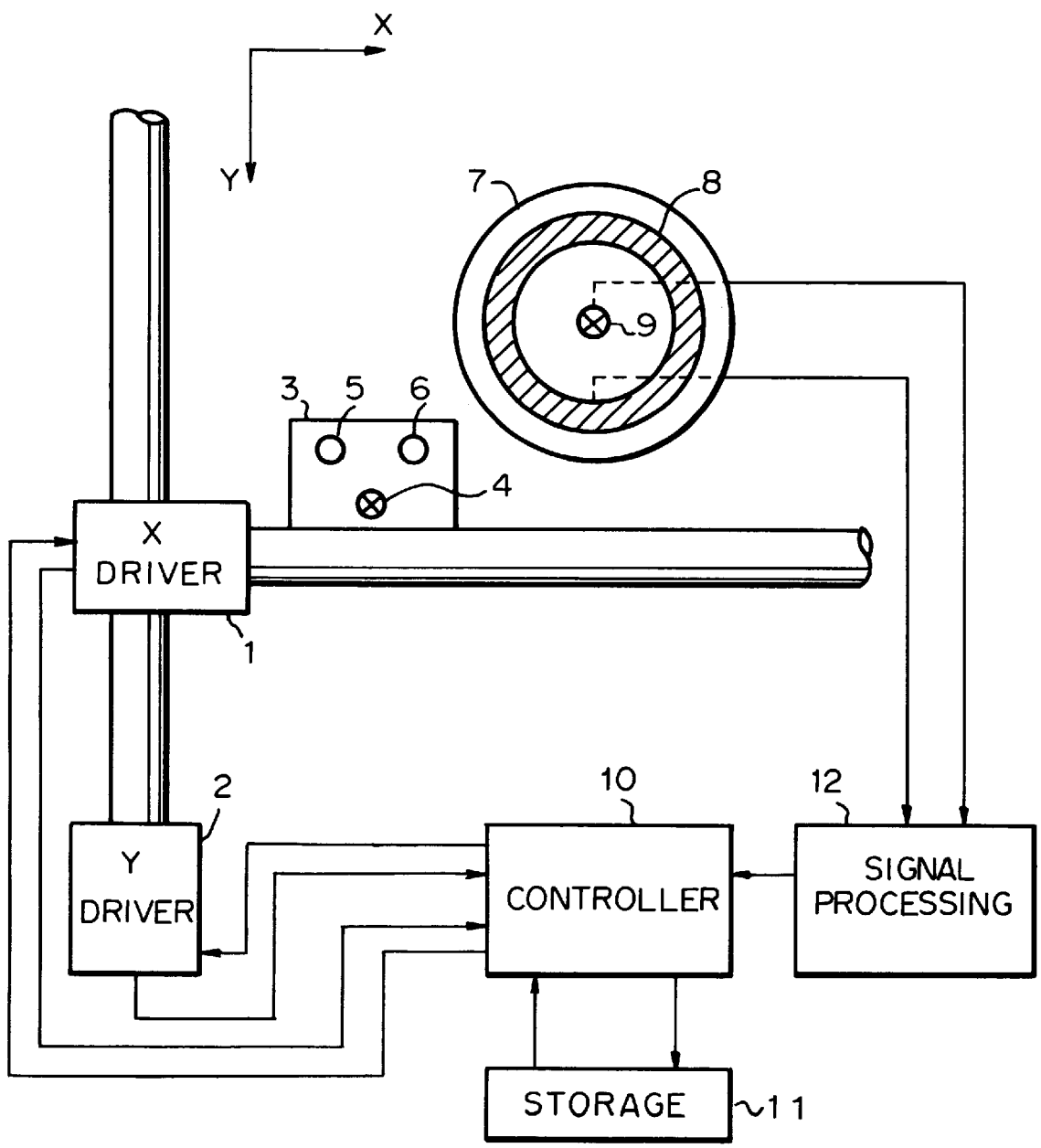
FIG. 2 is a view showing a coater embodying the present invention.

Referring to FIG. 2, a coater embodying the present invention is shown and includes a rotatable table 7 to be loaded with a semiconductor wafer or similar substrate, not shown. A point-like light-sensitive element 9 is located at the center of rotation of the table 7. An annular light-sensitive element 8 is positioned in the peripheral portion of the table 7. A block 3 is movable above the table 7 in X and Y directions. A light emitting element 4 is mounted on the block 3 for issuing light toward the light-sensitive elements 8 and 9.

The light to issue from the light emitting element 4 should preferably be light having a high wavelength selection characteristic and a long wavelength, e.g., infrared rays. The block 3 carries one or more nozzles 5 and 6 therewith. The block 3 with the light emitting element 4 is moved in the X direction and Y direction by an X driver 1 and a Y driver 2, respectively. A controller 10 is connected to the X driver 1 and Y driver 2 for controlling the displacements of the block 3. A signal processing 12 is connected to the controller 10 and receives the output signals of the two light-sensitive elements 8 and 9.

The signal processing 12 delivers to the controller 10 a signal indicative of whether or not the light-sensitive element 9 of the table 7 has received the light issuing from the light emitting element 4, and a signal representative of a time when the light-sensitive element 8 of the table 7 has received the light issuing from the element 4. In response to such signals, the controller 10 calculates distances over which the block 3 should be moved in the X and Y directions. A storage 11 is also connected to the controller 10 in order to store the displacements of the block 3. The storage 11 should preferable be implemented by a disk system.

Figure 3A:
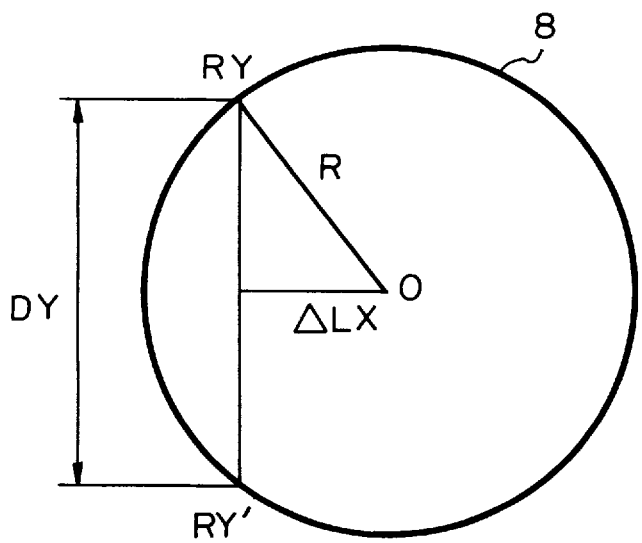
FIGS. 3A and 3B are diagrams demonstrating how the coater of FIG. 2 calculates correction amounts.
Figure 3B:
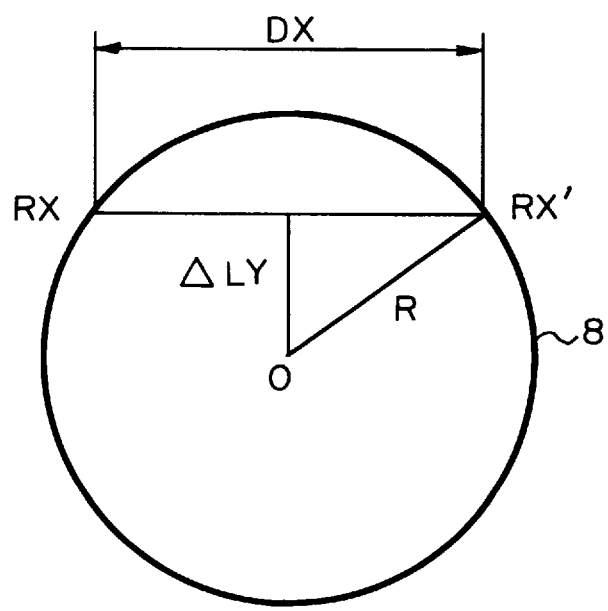

Reference will also be made to FIGS. 3A and 3B for describing a correction procedure for bringing the nozzles 5 and 6 to a position above the center of rotation of the table 7.

For the nozzles 5 and 6 to reach the above position, it is necessary that the light issuing from the light emitting element 4 be incident to the two light-sensitive elements 8 and 9. In light of this, adjustment is performed before a substrate, not shown, is laid on the table 7 or during the application of a liquid to the substrate. During initial setting, whether or not the nozzles 5 and 6 are positioned above the center of rotation of the table 7 is determined on the basis of the light issuing from the light emitting element 4. Specifically, displacements stored in the storage 11 are fed to the controller 10. In response, the controller 10 causes the X driver 1 and Y driver 2 to move the block 3. If the light issuing from the light emitting element 4 is accurately incident to the light-sensitive element 9 located at the center of the table 7, the controller 10 determines that the block 3 and table 6 are held in a preselected positional relation.

However, in the above condition, the nozzles 5 and 6 are not located above the center of rotation of the table 7 although the light emitting element 4 is done so. Therefore, the controller 10 further operates the X driver 1 and Y driver 2 until the nozzles 5 and 6 arrive at the position above the center of rotation of the table 7. Specifically, the distances between the light emitting element 4 and the nozzles 5 and 6 and their orientations are known beforehand, so that the block 3 is moved on the basis of such a positional relation. These displacements of the block 3 are also stored in the storage 11 beforehand.

Assume that the light issuing from the light emitting element 4 and the initial setting stage is not incident to the light-sensitive element 9. This shows that the light emitting element 4 is deviated from the center of rotation of the table 7. The block 3 must therefore be moved except when the distance and direction of deviation of the element 4 are ascribable to the positional relation between the element 4 and the nozzles 5 and 6. To locate the element 4 at the center of rotation of the table 7, the controller 10 calculates the distances between the element 4 and the center of rotation of the table 7 in the X and Y directions as correction amounts ΔLX and ΔLY, respectively, as shown in FIGS. 3A and 3B. At this instant, the prerequisite is that the element 4 be positioned inside of a ring defined by the annular light-sensitive element g of the table 7.

First, to calculate the correction amount ΔLX, the controller 10 causes the block 3 to move in the Y direction to a position where the light-emitting element is spaced from the annular light-sensitive element 8 in the Y direction. Then, the controller 10 causes the block 3 to move in the direction Y with the light emitting element 4 issuing the light, crossing the light-sensitive element 8. The controller 10 stops the movement of the block 3 when the block 3 reaches another position spaced from the light-sensitive element 8.

As shown in FIG. 3A, during the above movement of the block 3 in the Y direction, the light issuing from the light emitting element 4 is incident to the light-sensitive element 8 at two points RY and RY'. The controller 10 calculates the distance between the two points RY and RY', i.e., a chord DY. This can be done by multiplying the moving speed of the block 3 and the period of time needed for the block 3 to move the chord DY. Because the distance R between the center of rotation of the table 7 and the light-sensitive element 8 is known, the correction amount ΔLX in the X direction is produced by:

$$\Delta LX = |\sqrt{R^2 + (DX/2)^2}| \qquad \text{Eq. (1)}$$

The correction amount ΔLY in the Y direction is calculated in the same manner as the correction amount ΔLX, as follows. As shown in FIG. 3B, the controller 10 causes the block 3 to move in the direction X such that the light issuing from the light emitting element 4 is incident to the annular light-sensitive element 8 at two positions RX and RX'. Then, the controller 10 calculates the correction amount ΔLY on the basis of a relation between the distance between the points RX and RX', i.e., a chord DX and the distance R. The correction amount ΔLY is expressed as:

$$\Delta LY = |\sqrt{R^2 + (DY/2)^2}| \qquad \text{Eq. (2)}$$

Because the correction amounts ΔLX and ΔLY are absolute values, the controller 10 additionally can determine the direction in which the block 3 is deviated from the table 7, i.e, rightward or leftward and upward or downward. The determined direction is written to the storage 11. Subsequently, the controller 10 causes the X drive and Y driver 2 to move the block 3 by the sums of the initial displacements stored in the storage 11 and the positive or negative correction amounts. As a result, the light emitting element 4 is brought to the position above the light-sensitive element 9 located at the center of rotation of the table 7.

After the above adjustment of the nozzles 5 and 6, a substrate is laid on the table 7 and then caused to spin. In this condition, a liquid is dropped from the nozzles 5 and 6 onto the substrate. This allows the liquid to be evenly spread over the substrate, forming a uniform thin film.

Figure 4:
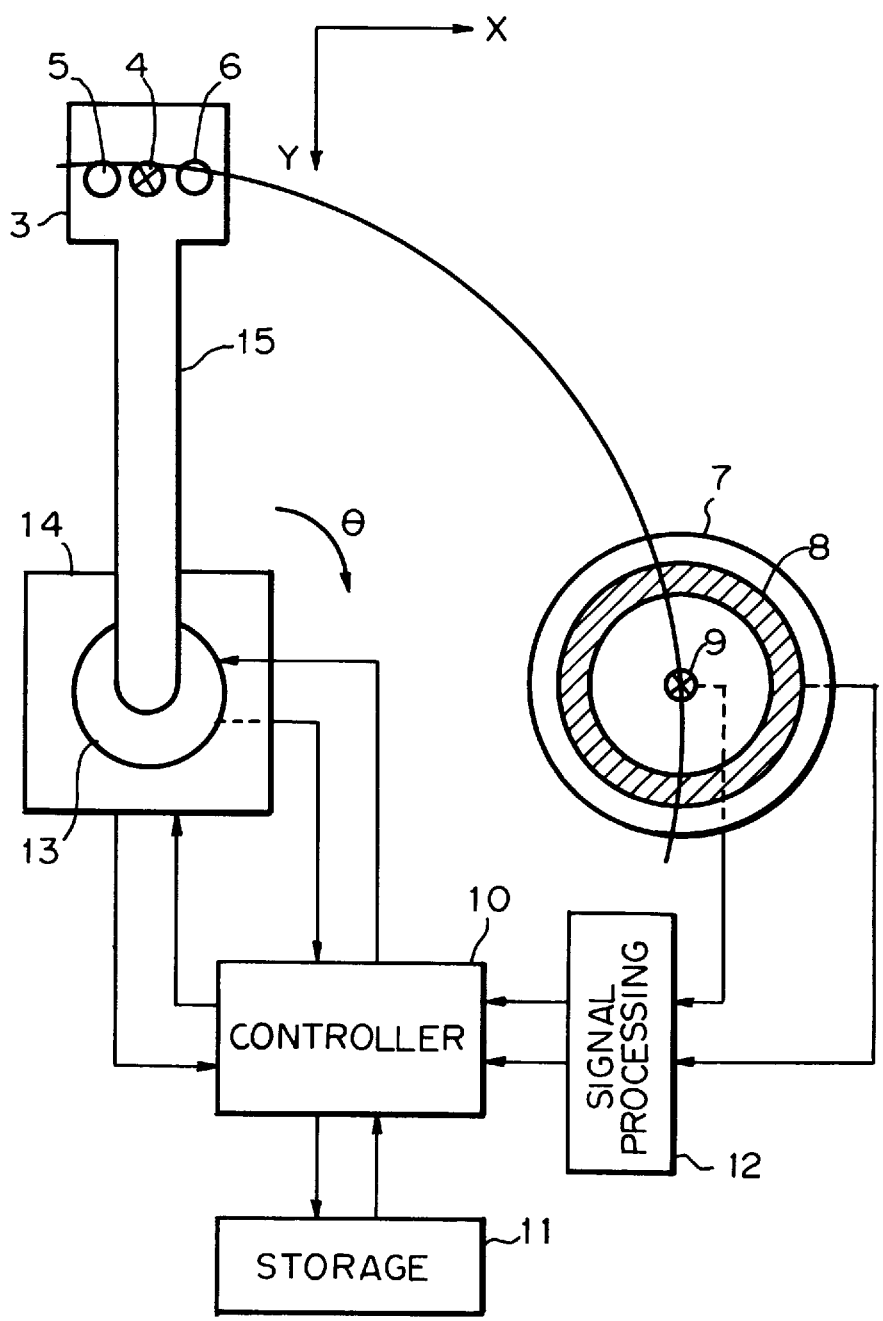
FIG. 4 is a view showing an alternative embodiment of the present invention.

An alternative embodiment of the present invention will be described with reference to FIG. 4. As shown, in the alternative embodiment, the block 3 carrying the light emitting element 4 and nozzles 5 and 6 therewith is mounted on the free end of a pivotable arm 15. The element 4 and nozzles 5 and 6 are arranged on the same radius of the arm 15. A rotation drive arrangement 13 is mounted on the other end of the arm 15 and selectively moved in the X and Y directions by an X-Y drive arrangement 14. The controller 10 is connected to the X-Y drive arrangement 14 while the storage 11 is connected to the controller 10, as in the previous embodiment.

Figure 5:
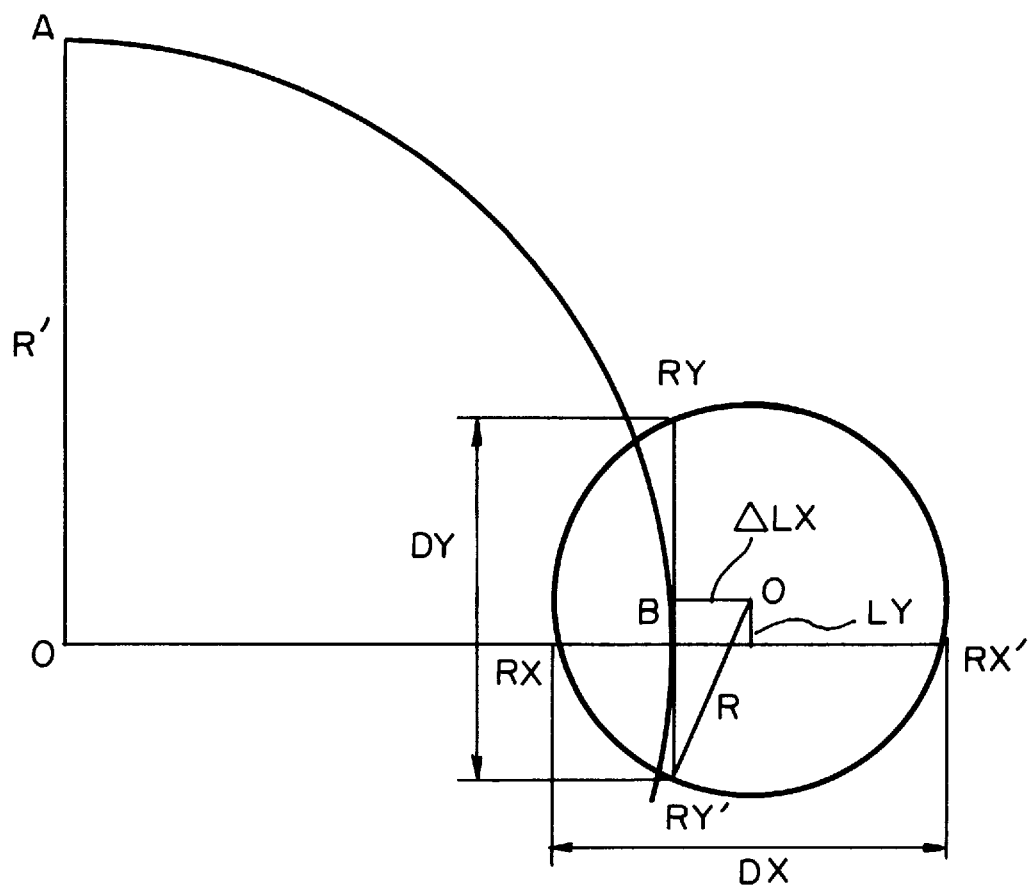
FIG. 5 are diagrams demonstrating how the alternative embodiment calculates correction amounts.

The table 7 is identical in configuration with the table 7 of the previous embodiment. The output signals of the light-sensitive elements 8 and 9 are sent to the signal processing 12 connected to the controller 10. A procedure for locating the nozzles 5 and 6 above the center of rotation of the table 7 will be described with reference also made to FIG. 5.

In the initial setting stage, whether or not the light emitting element 4 is located above the center of rotation of the table 7 is determined. Specifically, after the arm 15 has been rotated in the X direction, the light emitting element 4 is caused to emit light. If the light is incident to the light-sensitive element 9 located at the center of rotation of the table 7 the controller 10 determines that the element 4 and table 7 are held in the preselected positional relation. However, because the element 4 is slightly angularly spaced from the nozzles 5 and 6, the controller 10 causes the arm 15 to rotate clockwise or counterclockwise until the nozzles 5 and 6 reach the position above the center of rotation of the table 7.

If the light issuing from the light emitting element 4 at the initial setting stage is not incident to the light-sensitive element 9, the nozzles 5 and 6 basically cannot reach the position above the center of rotation of the table 7. The controller 10 therefore calculates the correction amounts ΔLX and ΔLY respectively representative of the distances between the element 4 and the center of rotation of the table 7 in the X and Y directions. For this purpose, the controller 10 fixes the arm 15 in the position rotated in the X axis and then causes the X-Y drive arrangement 14 to move the element 4 in the X and Y directions. The controller 10 also calculates the correction amounts ΔLX and ΔLY by use of the Eqs. (1) and (2) and moves the element 4 in accordance with the correction amounts ΔLX and ΔLY, as in the previous embodiment.

After the light emitting element 4 has been brought to the position above the center of rotation of the table 7, the controller 10 causes the arm 15 to rotate until the nozzles 5 and 6 reach the above position. Subsequently, a substrate is laid on the table 7, and then a liquid is dropped from the nozzles 5 and 6 onto the substrate. The liquid is spread evenly on the substrate due to the rotation of the substrate, forming a uniform thick film.

In summary, in accordance with the present invention, coater includes a rotatable table having an annular light-sensitive element on its peripheral portion. A block is movable above the table in X and Y directions while carrying a light emitting element therewith. The deviation of the light emitting element from the center of rotation of the table can be easily determined on the basis of whether or not light issuing from the light emitting element is incident to the light-sensitive element. Therefore, a nozzle or nozzles for dropping a liquid can be easily located at a position above the center of rotation of a substrate laid on the table, allowing the liquid to form a uniform thin film over the entire substrate. In addition, the procedure for so locating the nozzles is effected not manually, but automatically. This obviates irregularity as to positioning and reduces the inspection time to thereby enhance productivity.

Various modifications will become possible for those skilled in the art after receiving the teachings of the present disclosure without departing from the scope thereof.

What is claimed is:

1. A coater comprising;

a first light-sensitive element having an annular configuration and arranged in a peripheral portion of a rotatable table;

a block movable above said first light-sensitive element in an X direction and a Y direction; and a light emitting element mounted on said block for emitting light toward said first light-sensitive element.

2. A coater as claimed in claim 1, further comprising a controller for calculating a correction amount by which said first light-sensitive element should be moved, on the basis of a distance between two points on said first light-sensitive element and a radius of said first light-sensitive element by use of a Pythagorean theorem.

3. A coater as claimed in claim 2, wherein said controller is connected to said block.

4. A coater as claimed in claim 1, further comprising a second light-sensitive element located at a center of rotation of said table.

5. A coater as claimed in claim 4, further comprising a controller for calculating a correction amount by which said first light-sensitive element should be moved, on the basis of a distance between two points on said first light-sensitive element and a radius of said first light-sensitive element by use of the Pythagorean theorem.

6. A coater as claimed in claim 5, wherein said controller is connected to said block.

7. A coater as claimed in claim 1, wherein said block is mounted on a free end of a pivotable arm.

8. A coater as claimed in claim 7, further comprising a second light-sensitive element located at a center of rotation of said table.

9. A coater as claimed in claim 8, further comprising a controller for calculating a correction amount by which said first light-sensitive element should be moved, on the basis of a distance between two points on said first light-sensitive element and a radius of said first light-sensitive element by use of the Pythagorean theorem.

10. A coater as claimed in claim 9, wherein said controller is connected to said block.

\* \* \* \* \*